US011143703B2

(12) United States Patent
Fridburg et al.

(10) Patent No.: US 11,143,703 B2
(45) Date of Patent: Oct. 12, 2021

(54) METHOD AND APPARATUS FOR TESTING A MULTI-DIE INTEGRATED CIRCUIT DEVICE

(71) Applicant: Marvell Israel (M.I.S.L) Ltd., Yokne'am (IL)

(72) Inventors: Michael Fridburg, Gan Yavne (IL); Erez Menahem, Mishmar David (IL); Peter Brokhman, Qiryat Ata (IL)

(73) Assignee: Marvell Israel (M.I.S.L) Ltd., Yokne'am (IL)

( * ) Notice: Subject to any disclaimer, the term of this patent is extended or adjusted under 35 U.S.C. 154(b) by 97 days.

(21) Appl. No.: 16/583,639

(22) Filed: Sep. 26, 2019

(65) Prior Publication Data

US 2020/0103464 A1 Apr. 2, 2020

Related U.S. Application Data

(60) Provisional application No. 62/738,413, filed on Sep. 28, 2018.

(51) Int. Cl.
*G01R 31/3177* (2006.01)
*G01R 31/317* (2006.01)

(52) U.S. Cl.
CPC ... *G01R 31/3177* (2013.01); *G01R 31/31716* (2013.01); *G01R 31/31724* (2013.01)

(58) Field of Classification Search
CPC .......... G01R 31/3177; G01R 31/31716; G01R 31/31724; G01R 31/318558; G01R 31/318533
See application file for complete search history.

(56) References Cited

U.S. PATENT DOCUMENTS

| 5,535,222 | A | * | 7/1996 | Le | G01R 31/318558 |
| | | | | | 714/726 |
| 6,311,302 | B1 | | 10/2001 | Cassetti et al. | |
| 6,587,981 | B1 | * | 7/2003 | Muradali | G01R 31/318555 |
| | | | | | 714/726 |
| 6,686,759 | B1 | | 2/2004 | Clevenger et al. | |
| 6,760,873 | B1 | * | 7/2004 | Hao | G01R 31/3016 |
| | | | | | 324/73.1 |
| 7,945,827 | B1 | * | 5/2011 | Briggs | G01R 31/318563 |
| | | | | | 714/724 |

(Continued)

FOREIGN PATENT DOCUMENTS

KR 20030027989 4/2003

*Primary Examiner* — April Y Blair
*Assistant Examiner* — Matthew W Wahlin

(57) ABSTRACT

A method for scan chain testing a multi-chip module including a plurality of integrated circuit dice, some of the integrated circuit dice being of a first type and some of the integrated circuit dice being of a second type, includes separately applying a first boundary scan test stream to each die of the first type, and a second boundary scan test stream to each die of the second type. Testing apparatus includes a test interface that couples to each respective test access port, and a controller configured to separately apply the first boundary scan test stream to each die of the first type, and the second boundary scan test stream to each die of the second type. A multi-chip module includes a plurality of integrated circuit dice, each having a boundary scan register chain with a test access port, and a test access port for the module as a whole.

16 Claims, 4 Drawing Sheets

(56) References Cited

U.S. PATENT DOCUMENTS

| | | |
|---|---|---|
| 2004/0006729 A1 | 1/2004 | Pendurkar |
| 2009/0144592 A1 | 6/2009 | Chakraborty et al. |
| 2009/0206863 A1* | 8/2009 | McGarry ................ H01L 22/32 324/754.23 |
| 2016/0003909 A1* | 1/2016 | Whetsei ............. G01R 31/3172 714/727 |
| 2016/0282414 A1* | 9/2016 | Gielarowski .... G01R 31/31716 |

\* cited by examiner

METHOD AND APPARATUS FOR TESTING A MULTI-DIE INTEGRATED CIRCUIT DEVICE

CROSS REFERENCE TO RELATED APPLICATION

This disclosure claims the benefit of commonly-assigned U.S. Provisional Patent Application No. 62/738,413, filed Sep. 28, 2018, which is hereby incorporated by reference herein in its entirety.

FIELD OF USE

This disclosure relates to diagnostic operations for integrated circuit devices. More particularly, this disclosure relates to a test method and apparatus to simplify and speed up test preparation, as well as testing, of individual dice on a multi-chip module.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Integrated circuit devices may be tested by scan chain techniques in which a serial data stream is propagated through the device and the output data stream is examined to see if any of the bits in the data stream have changed. Such testing may be conducted according to the "JTAG" standard promulgated as IEEE1149. However, the JTAG standard is designed for an individual die or "chip." In the case of a multi-chip module—i.e., a single package incorporating multiple individual integrated circuit devices—the JTAG standard accommodates testing of the overall package. The JTAG standard also may accommodate separate testing of each individual die, but some of the individual dice may not be amenable to scan chain testing on a standalone basis, and moreover, scan chain testing, even of the overall package, may not accurately test all die-to-die interconnections.

SUMMARY

A method, according to implementations of the subject matter of this disclosure, for scan chain testing of a multi-chip module including a plurality of integrated circuit dice, at least two of the integrated circuit dice being of a same first type and at least one of the integrated circuit dice being of a second type different from the first type, includes separately applying a first boundary scan test stream to each integrated circuit die of the first type of integrated circuit dice, and separately applying a second boundary scan test stream to each integrated circuit die of the second type of integrated circuit dice.

In a first implementation of such a method, the applying a first boundary scan test stream to each integrated circuit die of the first type of integrated circuit dice includes applying a first boundary scan test stream configured to test each respective integrated circuit die of the first type of integrated circuit dice in both transmit and receive directions, and the applying a second boundary scan test stream to each integrated circuit die of the second type of integrated circuit dice includes applying a second boundary scan test stream configured to test each respective integrated circuit die of the second type of integrated circuit dice in both transmit and receive directions.

In a first variant of that first implementation, the applying a first boundary scan test stream and the applying a second boundary scan test stream may be performed by merging the first boundary scan test stream and the second boundary scan test stream and applying the merged streams. According to one alternative, applying the merged streams may include applying, seriatim, portions of the merged streams corresponding to the first boundary scan test stream and the second boundary scan test stream. According to another alternative, applying the merged streams may include applying, in parallel, portions of the merged streams corresponding to the first boundary scan test stream and the second boundary scan test stream.

In a second variant of that first implementation, configuring one of the boundary scan test streams to test a respective integrated circuit die in both transmit and receive directions may include configuring the one of the boundary scan test streams to test loopback of transmit and receive pins of the respective integrated circuit die.

According to one alternative of that second variant of the first implementation, when the respective integrated circuit die has a first boundary scan register chain of a certain length and is connected for transmission to and reception from another integrated circuit die having a second boundary scan register chain of the certain length, configuring the one of the boundary scan test streams to test loopback of transmit and receive pins of the respective integrated circuit die may include configuring direct loopback of the transmit and receive pins.

According to a second alternative of that second variant of the first implementation, when the respective integrated circuit die has a first boundary scan register chain of a certain length and is connected for transmission to and reception from another integrated circuit die having a second boundary scan register chain of a second length different from the certain length, configuring the one of the boundary scan test streams to test loopback of transmit and receive pins of the respective integrated circuit die may include configuring delayed loopback of the transmit and receive pins.

In that second alternative of that second variant of the first implementation, the configuring delayed loopback of the transmit and receive pins may include adding idle cycles to a shorter one of the first and second boundary scan register chains.

A second implementation of such a method includes applying a third boundary scan test stream to the multi-chip module as a whole.

Testing apparatus, according to implementations of the subject matter of this disclosure, for scan chain testing of a multi-chip module including a plurality of integrated circuit dice, at least two of the integrated circuit dice being of a same first type and at least one of the integrated circuit dice being of a second type different from the first type, each respective integrated circuit die having a respective test access port, includes a test interface that couples to each respective test access port, and a controller configured to separately apply, via the test interface, a first boundary scan test stream to a respective test access port of each integrated circuit die of the first type of integrated circuit dice, and separately apply, via the test interface, a second boundary scan test stream to a respective test access port of each integrated circuit die of the second type of integrated circuit dice.

In a first implementation of such a testing apparatus, the controller is configured to apply, via the test interface, the respective first boundary scan test stream to the respective test access port of the first type of integrated circuit dice in both transmit and receive directions, and apply, via the test interface, the respective second boundary scan test stream to the respective test access port of the second type of integrated circuit dice in both transmit and receive directions.

In a first variant of that first implementation of the testing apparatus, the controller may be configured to apply, seriatim, the respective first boundary scan test stream to the respective test access port of the first type of integrated circuit dice and the respective second boundary scan test stream to the respective test access port of the second type of integrated circuit dice.

In a second variant of that first implementation of the testing apparatus, the controller may be configured to apply, in parallel, the respective first boundary scan test stream to each respective test access port of the first type integrated circuit dice and the respective second boundary scan test stream to each respective test access port of the second type of integrated circuit dice.

In a third variant of that first implementation of the testing apparatus, the controller may be configured to test loopback of transmit and receive pins of each respective integrated circuit die.

According to one alternative of that third variant of that first implementation of the testing apparatus, when the respective integrated circuit die has a first boundary scan register chain of a certain length and is connected for transmission to and reception from another integrated circuit die having a second boundary scan register chain of the certain length, the controller may be configured to test direct loopback of transmit and receive pins of the respective integrated circuit die.

According to a second alternative of that third variant of that first implementation of the testing apparatus, when the respective integrated circuit die has a first boundary scan register chain of a certain length and is connected for transmission to and reception from another integrated circuit die having a second boundary scan register chain of a second length different from the certain length, the controller is configured to test delayed loopback of transmit and receive pins of the respective integrated circuit die.

In that second alternative of that third variant of that first implementation of the testing apparatus, the controller may be configured to delay loopback of the transmit and receive pins by adding idle cycles to a shorter one of the first and second boundary scan register chains.

In a second implementation of such a testing apparatus, the controller is configured to apply a third boundary scan test stream to a test access port of the multi-chip module as a whole.

A multi-chip module according to implementations of the subject matter of this disclosure includes a plurality of integrated circuit dice, each respective integrated circuit die comprising a respective boundary scan register chain and a respective test access port for the respective boundary scan register chain, and a test access port for testing of the multi-chip module as a whole.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
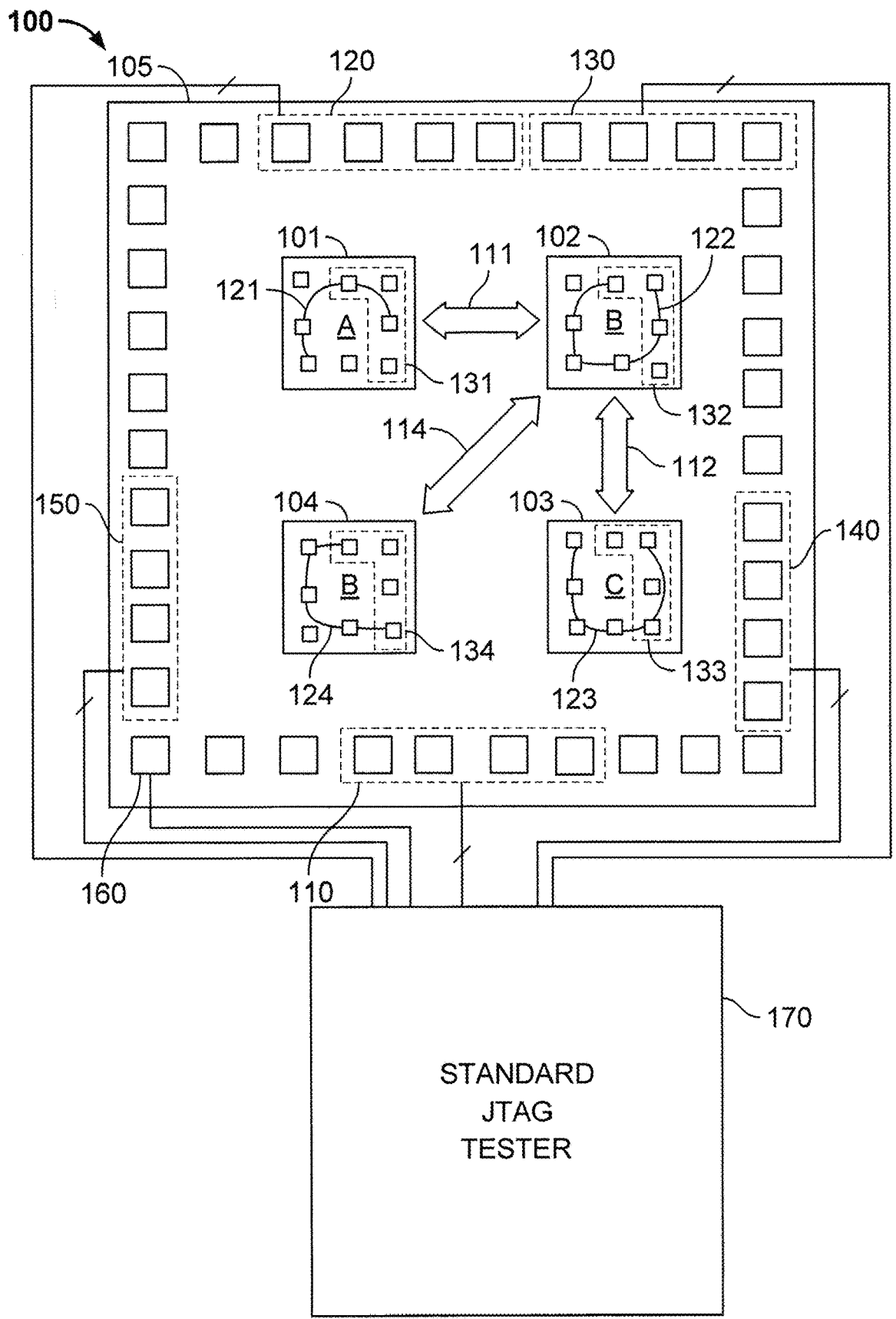
FIG. 1 is a schematic representation of a multi-chip module with which the subject matter of this disclosure may be used, along with a first implementation of a testing device.
Figure 2:
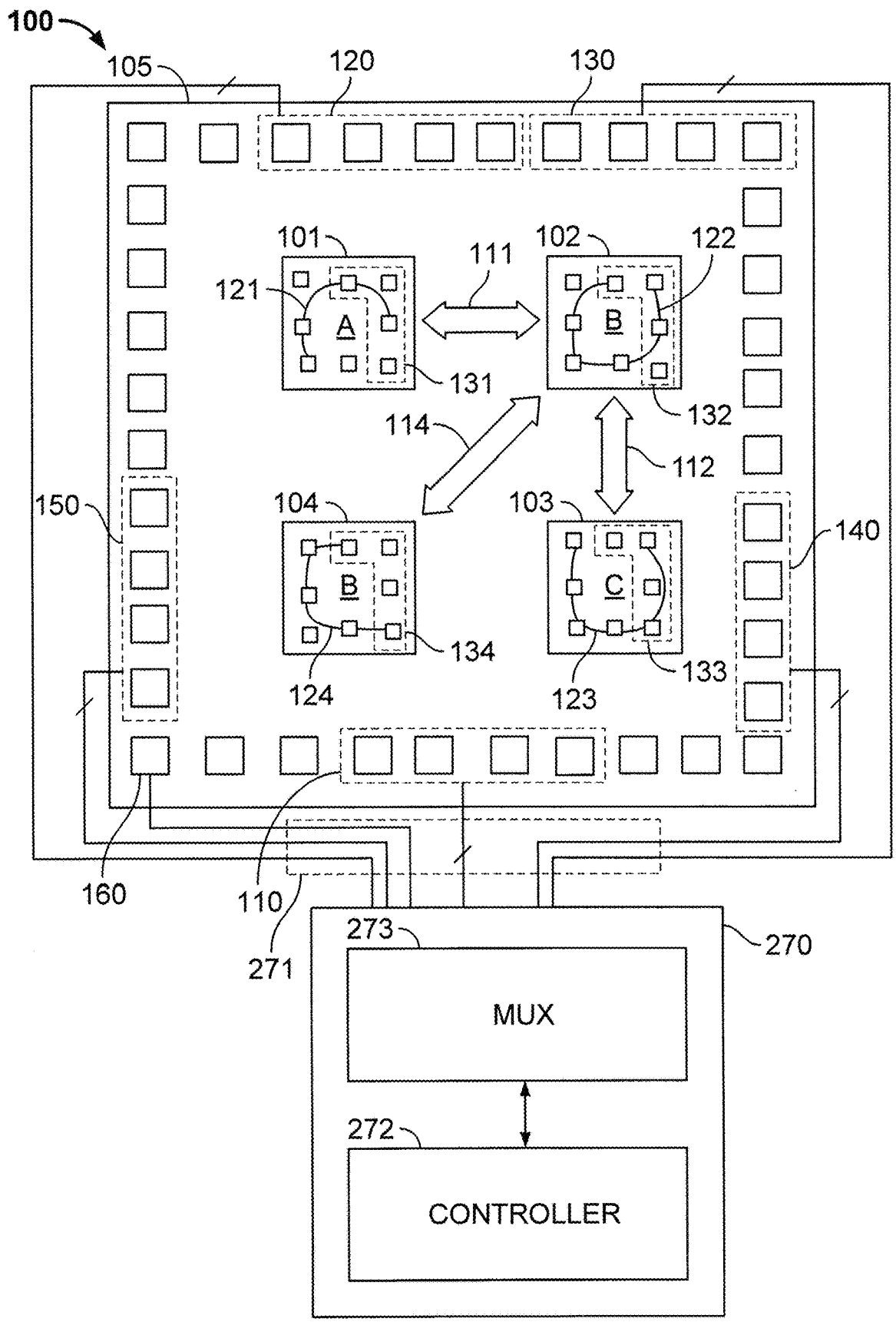
FIG. 2 is a schematic representation similar to FIG. 1, along with a second implementation of a testing device.

As noted above, in the case of a multi-chip module—i.e., a single package incorporating multiple individual integrated circuit devices, which may be a modular chip device such as that described in U.S. Patent Application Publication No. 2015/0169495 or any system-on-chip (SoC)—the JTAG standard accommodates testing of the overall package. However, a JTAG daisy chain encompassing all dice in the package may be very long. Any defect in any die in that chain would result in a failure by the device, but would not isolate the defect to a particular die. Moreover, the long chain may affect the timing of the test signals. In addition, the dice in the chain would have to be tested serially, in the order in which the chain passes through them, and without the possibility of multicast or simultaneous testing, or any other configurability of the testing.

The JTAG standard also may accommodate separate testing of each individual die, but some of the individual dice may not be amenable to scan chain testing on a standalone basis, and moreover, scan chain testing, even of the overall package, may not accurately test all die-to-die interconnections.

Implementations of the subject matter of this disclosure continue to allow testing of individual dice, and testing of the overall package, while facilitating testing of die-to-die interconnections.

First, in accordance with implementations of the subject matter of this disclosure, boundary scan testing pins of each die are "exposed"—i.e., made available at package pins. For example, under the IEEE1149 standard for JTAG testing, five pins are required—clock, reset, test_data_in (TDI), test_data_out (TDO) and test_mode_select (TMS). In accordance with implementations of the subject matter of this disclosure, at least the TDI, TDO and TMS pins of each individual die are made available at pins of the multi-die package. In order to access the test functions of individual dice, each die has its own Test Access Port (TAP), as opposed to a single TAP for the entire package.

The test pins may be multiplexed with run-time functional signals, so that during normal operation, the package pins are used for the run-time functional signals, but applying a signal to a test control pin initiates a test mode that changes certain package pins to boundary scan testing pins for testing of individual dice, and optionally also for device-wide testing. The test control pin itself could also have a different run-time function but may, for example, initiate the test mode when an extra-high voltage, or other unique signal, is applied.

In accordance with a further aspect of implementations of the subject matter of this disclosure, and in recognition of the fact that in many multi-chip modules, the number of types of dice is smaller than the total number of dice (i.e., multiple instances of certain types of dice may be included), the number of test instruction files that are required (e.g., Boundary Scan Description Language, or BSDL, files under the IEEE1149 JTAG standard) is reduced. Specifically, rather than needing a separate test stream for each individual die, the same test stream can be used for all instances of a particular die type.

Each test stream includes patterns for testing the die type to which it applies in both receive mode and transmit mode. The interconnections to other dice are represented as loop-back connections of the appropriate pins, as shown below. To accommodate different interconnections of different instances of a particular die type to each other, or to dice of other types, the test stream can include patterns for different test modes that include a receive mode and a transmit mode for each type of interconnection that is encountered by the particular die type. Alternatively, a separate test stream may be included for each die type/interconnection type pair that may be encountered, including a receive mode and a transmit mode for that die type/interconnection type pair.

Because different die types may have boundary scan registers of different lengths, the test stream, or a portion thereof, for testing a particular interconnection between two different die types, implements idle cycles for the die type with the shorter boundary scan register to align the shift phases of the boundary scan registers. This alignment function may be implemented under the IEEE1194 JTAG standard using the Pause-IR and Pause-DR state flows of the JTAG state machine.

Thus, rather than having one test stream per die, in implementations of the subject matter of this disclosure, there may be as few as one test stream per die type.

In addition, the individual test streams can be merged into a single test stream, in which each individual test serves as a separate port of the merged test pattern for the entire package. The individual ports can run in parallel on a testing device. In a case where there are any identical dice in the package, the individual die test for that die type will be multiplied and executed N times in parallel, where N equals the number of identical dice.

Thus, the run-time for testing of the entire package is decreased substantially by running tests of individual dice in parallel.

Implementations of subject matter of this disclosure may be illustrated with reference to FIGS. 1-5.

FIG. 1 is a schematic representation of a multi-chip module 100 with which the subject matter of this disclosure may be used, including four integrated circuit dice 101, 102, 103, 104 in a single package 105. The number of integrated circuit dice is merely illustrative, and a multi-chip module with which the subject matter of this disclosure may be used can include any number of integrated circuit dice.

As shown, in this example, there are connections from each integrated circuit die 101, 102, 103, 104 to pins of package 105. In addition, there is an intra-package connection 111 between die 101 and die 102, an intra-package connection 112 between die 102 and die 103, and an intra-package connection 114 between die 102 and die 104. Although pins are shown on each die 101, 102, 103, 104, the specific pin-to-pin connections making up die-to-die connections 111, 112, 114 are not shown.

In this example, dice 102 and 104 are of the same die type (for illustration purposes this is designated "Type B"), while die 101 (designated "Type A" for illustration purposes) and die 103 (designated "Type C" for illustration purposes) are different from each other and from dice 102 and 104. Thus, in accordance with implementations of the subject matter of this disclosure, there are three types of test instruction files—one for a Type A die, one for a Type B die, and one for a Type C die—associated with multi-chip module 100. Each test instruction file, which may be a BSDL file, includes instructions for scanning its respective die type as a receiver of data from another die, and as a transmitter of data to another die, as described above and as illustrated below.

In accordance with known boundary scan techniques, each die 101, 102, 103, 104 has its own boundary scan register chain 121, 122, 123, 124. Boundary scan register chains 121-124 are interconnected (not shown) into a single boundary scan chain for multi-chip module 100, which has a group 110 of boundary scan pins, which, in the case of the IEEE1149 standard for JTAG testing, are clock, reset, TDI, TDO and TMS, as described above. In addition, in accordance with implementations of the subject matter of this disclosure, each die 101, 102, 103, 104 has its own respective group 131, 132, 133, 134 of boundary scan pins, each group functioning as a respective Test Access Port (TAP) including at least TDI, TDO and TMS pins. These four groups 131-134 of individual die boundary scan pins are exposed at groups 120, 130, 140, 150 of pins of package 105.

As discussed above, package test pin groups 110 (for multi-chip module 100) and 120, 130, 140, 150 (for the individual dice 101, 102, 103, 104), may have other uses during run-time of multi-chip module 100. In such a case, a test control pin 160 is provided. Applying a signal to test control pin 160 changes the functions of groups 110, 120, 130, 140, 150 of pins from their run-time function to their boundary scan test mode functions. Control pin 160 itself may have a separate run-time function. For example, at ordinary signal voltages, control pin 160 may have a run-time function, but if an extra-high voltage (for example, in a TTL system, a voltage substantially above 5V—e.g., 10V) is applied to control pin 160, the functions of the pins in groups 110, 120, 130, 140, 150 of pins change from their run-time functions to their boundary scan test mode functions.

Boundary scan test functions are carried out using a boundary scan test device 170, which connects to at least test control pin 160 (to place multi-chip module 100 in boundary scan testing mode), and to test pins in pin groups 110, 120, 130, 140, 150. If boundary scan test device 170 is a standard boundary scan test device, such as one designed to operate under the IEEE1149 JTAG standard, then boundary scan test device 170 would be connected, at any one time, to test control pin 160 and to test pins in one of pin groups 110, 120, 130, 140, 150.

However, boundary scan test device 270 (FIG. 2) could be a test device designed specifically to operate in accordance with implementations of the subject matter of this disclosure. In such a case, boundary scan test device 270 could be connected simultaneously to test control pin 160 and to test pins in all of pin groups 110, 120, 130, 140, 150. Because it is unlikely that such a boundary scan test device would be custom built for each multi-chip module, the number of pins to which it connects is programmable, up to a maximum number of physical pin connections provided on boundary scan test device 270.

Boundary scan test device 270 includes, in addition to pin connectors 271, control/processing circuitry 272 (which may be a microprocessor or microcontroller executing suitable instructions, or may be circuitry hard-wired to perform the necessary control/processing functions) for carrying out boundary scan test instructions (e.g., in a BSDL testing file). Control/processing circuitry 272 also controls multiplexing circuitry 273 to activate pin connections 271 to connect to the appropriate pins 110, 120, 130, 140, 150, as well as control pin 160, on multi-chip module 100.

Whether a standard JTAG boundary scan test device 170, or a boundary scan test device 270 specifically designed for use with implementations of the subject matter of this disclosure, is used, the boundary scan test device 170/270 implements a respective BSDL file for each type of die within dice 101-104. For each die 101-104, the respective BSDL file will carry out tests of the respective one of dice 101-104 as both a receiver of data and a transmitter of data in order to test each die's connectivity to other dice in multi-chip module 100. The number of separate BSDL files is at most equal to the number of dice, insofar as each BSDL file corresponds to a die type rather than to a die. For the example shown, three BSDL files are needed, insofar as two of the four dice are of the same type. However, even if two dice are of the same type, the resulting test may be different if the connectivity of the different dice of the same type to other dice (of the same or other types) is different.

Figure 4:
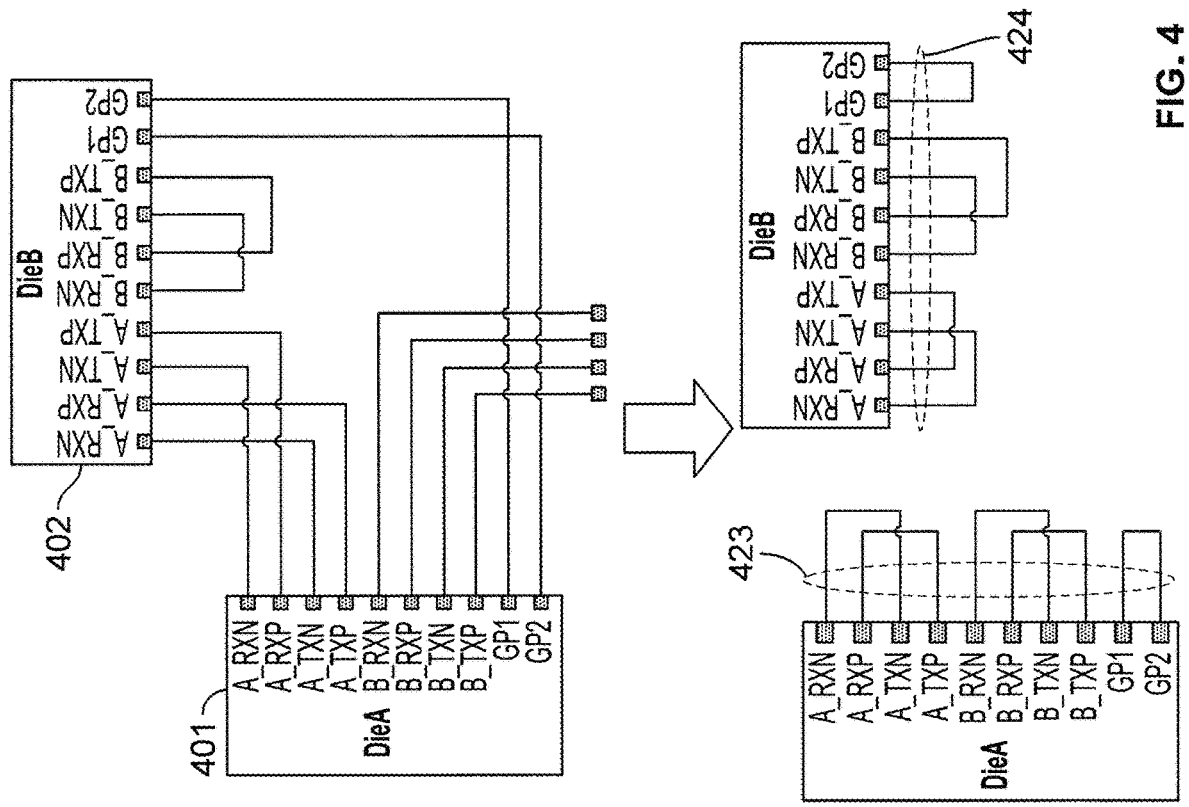
FIG. 4 shows how connectivity between differing integrated circuit dice may be modeled in accordance with implementations of the subject matter of this disclosure.
Figure 3:
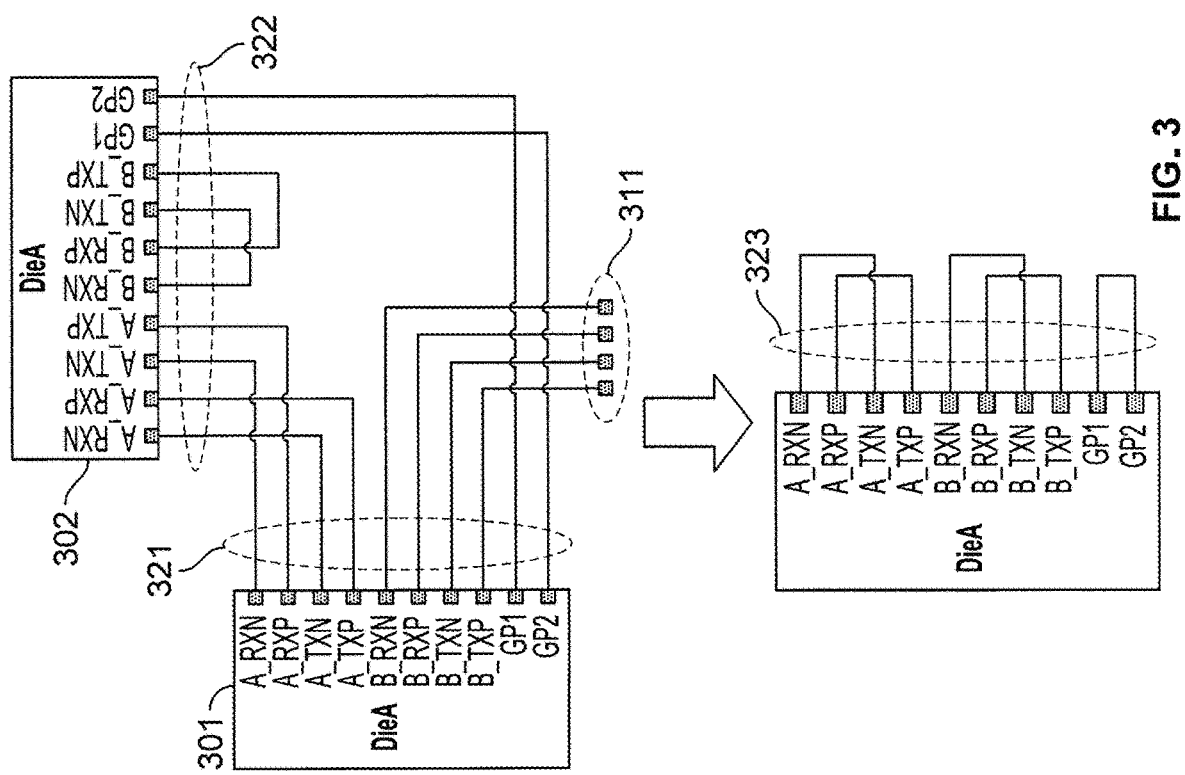
FIG. 3 shows how connectivity between identical integrated circuit dice may be modeled in accordance with implementations of the subject matter of this disclosure.
Figure 5:
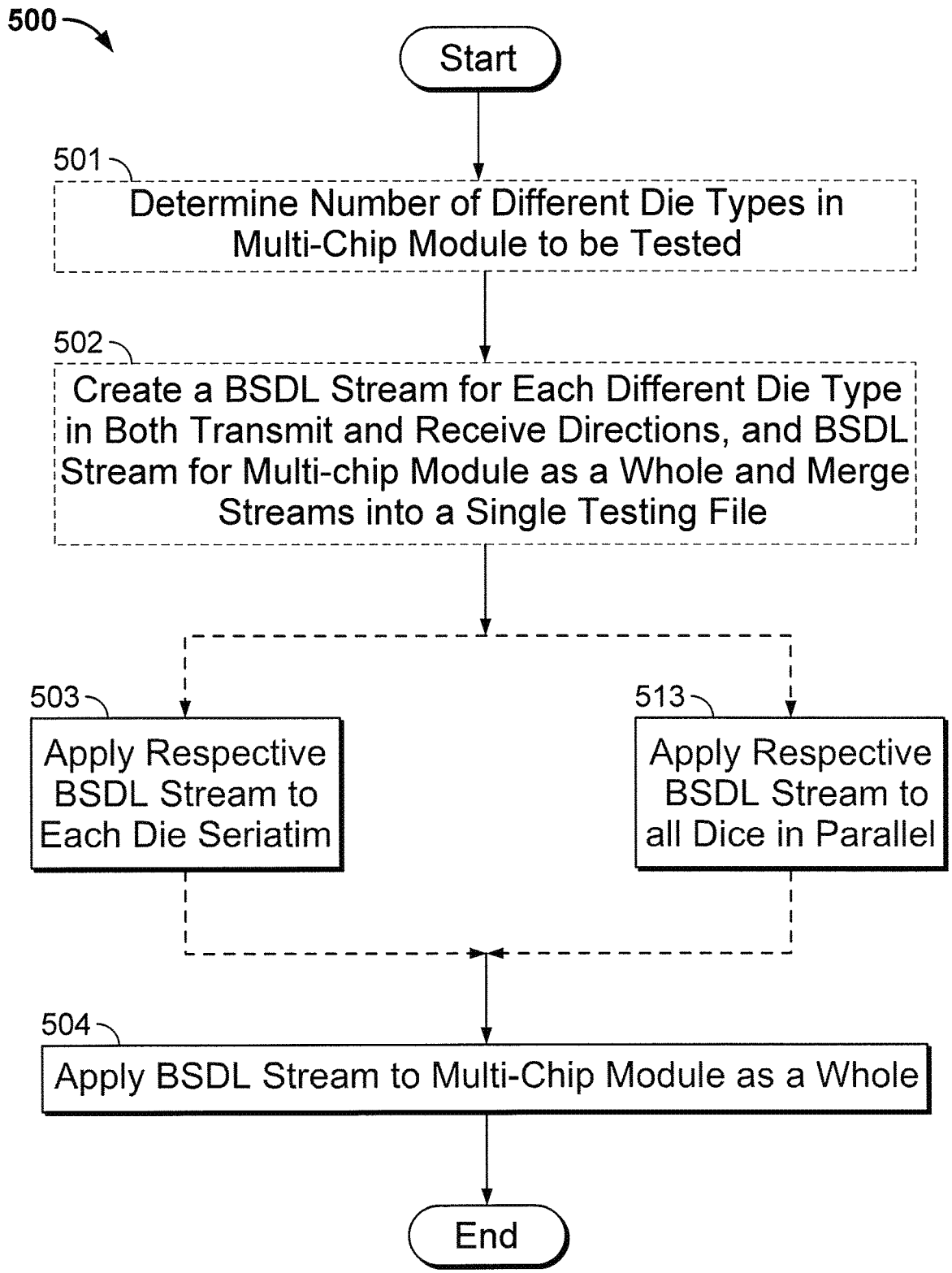
FIG. 5 is a flow diagram of an implementation of a method according to the subject matter of this disclosure.

Because each BSDL file is designed to test a single die at a time, the actual connection between two dice is not tested. Rather, the connection is simulated as shown in FIGS. 3 and 4. FIG. 3 shows how two dice 301, 302, both of Type A, are interconnected. Certain pins 311 of die 301 communicate with other parts of multi-chip module 100 (including possibly external-facing input/output pins). However, all other pins 321 of die 301 connect to corresponding pins 322 of die 302. In order to test that connectivity, the BSDL file for die 301 models the inputs and outputs of pins 321 with appropriate loopbacks 323. Thus, if each die 301, 302 has a pin A_RXN connected to a pin A_TXN of the other die 302, 301, the BSDL file models a loopback of A_RXN to A_TXN of a single die. As noted above, only one BSDL file is needed for each die type, and thus the same loopback function works whether the BSDL file is being used to test die 301 or die 302.

FIG. 4 shows a similar loopback arrangement for each of two dice 401, 402, which are, respectively, of two different die types A and B. The loopback arrangements 423, 424 are similar to that in FIG. 3. However, if the BSR lengths of the two die types A and B are not the same, then the BSDL file implements appropriate JTAG Pause-IR and Pause-DR functions during the simulated connection to add idle cycles to the simulated signals from the die with the shorter BSR length, to align the data flows.

Each die of a particular type in multi-chip module 100 can be tested by the same BSDL test instruction file, with those tests taking place seriatim. However, in accordance with implementations of the subject matter of this disclosure, each type of BSDL test instruction file needed to test a particular multi-chip module 100 can be replicated so that there is a copy of that type of BSDL test instruction file for each die of that type, and the various copies of that BSDL test instruction file, as well as copies of other BSDL test instructions files needed for other die types in the same multi-chip module 100 can be merged into a single larger test instruction file. In such an implementation, each copy of one of the smaller test instruction files within the larger combined test instruction file is executed in parallel with the other smaller test instruction files within the larger combined test instruction file, with each copy of a smaller test instruction file running on a respective test access port (TAP) of a respective die in multi-chip module 100.

A method of operating a testing system such as that described above is diagrammed in FIG. 5. Method 500 starts preliminarily at 501, which may be performed in advance as part of system setup (and therefore is shown in dashed outline), where the number of different die types within the multi-chip module to be tested, is performed. Next, at 502, also potentially preliminarily, a BSDL stream is created for each different die type in both transmit and receive directions. A BSDL stream also is created for the multi-chip module as a whole. The various BSDL streams are merged into a single testing file.

Next, in one variant or option, at 503, each BSDL stream is separately applied to test each individual die, seriatim, until all dice have been tested. Alternatively, in a second variant or option, at 513, all BSDL streams are applied in parallel to test all individual dies simultaneously. Next, at 504, the BSDL stream for the multi-chip module as a whole is applied to test the multi-chip module as a whole, and method 500 ends.

Thus it is seen that a test method and apparatus to speed up testing of individual dice on a multi-chip module, both by simulating connectivity in both directions, and by combining tests to run in parallel, have been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method for scan chain testing of a multi-chip module including a plurality of integrated circuit dice, at least two of the integrated circuit dice being of a same first type and at least one of the integrated circuit dice being of a second type different from the first type, the method comprising:
    separately applying a first boundary scan test stream to each integrated circuit die of the first type of integrated circuit dice, the separately applying including configuring the first boundary scan test stream to test each integrated circuit die of the first type of integrated circuit dice in both transmit and receive directions by simulating loopback of transmit and receive pins of the respective integrated circuit die of the first type of integrated circuit dice; and
    separately applying a second boundary scan test stream to each integrated circuit die of the second type of integrated circuit dice, the separately applying including configuring the second boundary scan test stream to test each integrated circuit die of the second type of integrated circuit dice in both transmit and receive directions by simulating loopback of transmit and receive pins of the respective integrated circuit die of the second type of integrated circuit dice.

2. The method of claim 1 wherein the applying a first boundary scan test stream and the applying a second boundary scan test stream are performed by merging the first boundary scan test stream and the second boundary scan test stream and applying the merged streams.

3. The method of claim 2 wherein applying the merged streams comprises applying, seriatim, portions of the merged streams corresponding to the first boundary scan test stream and the second boundary scan test stream.

4. The method of claim 2 wherein applying the merged streams comprises applying, in parallel, portions of the merged streams corresponding to the first boundary scan test stream and the second boundary scan test stream.

5. The method of claim 1 wherein, when the respective integrated circuit die has a first boundary scan register chain of a certain length and is connected for transmission to and reception from another integrated circuit die having a second boundary scan register chain of the certain length, configuring the one of the boundary scan test streams to simulate loopback of transmit and receive pins of the respective integrated circuit die comprises simulating direct loopback of the transmit and receive pins.

6. The method of claim 1 wherein, when the respective integrated circuit die has a first boundary scan register chain of a certain length and is connected for transmission to and reception from another integrated circuit die having a second boundary scan register chain of a second length different from the certain length, configuring the one of the boundary scan test streams to simulate loopback of transmit and receive pins of the respective integrated circuit die comprises simulating delayed loopback of the transmit and receive pins.

7. The method of claim 6 wherein the simulating delayed loopback of the transmit and receive pins comprises adding idle cycles to a shorter one of the first and second boundary scan register chains.

8. The method of claim 1 further comprising applying a third boundary scan test stream to the multi-chip module as a whole.

9. Testing apparatus for scan chain testing of a multi-chip module including a plurality of integrated circuit dice, at least two of the integrated circuit dice being of a same first type and at least one of the integrated circuit dice being of a second type different from the first type, each respective integrated circuit die having a respective test access port, the testing apparatus comprising:
   a test interface that couples to each respective test access port; and
   a controller configured to:
   separately apply, via the test interface, a first boundary scan test stream to a respective test access port of each integrated circuit die of the first type of integrated circuit dice, the separately applying including configuring the first boundary scan test stream to test each integrated circuit die of the first type of integrated circuit dice in both transmit and receive directions by simulating loopback of transmit and receive pins of the respective integrated circuit die of the first type of integrated circuit dice; and
   separately apply, via the test interface, a second boundary scan test stream to a respective test access port of each integrated circuit die of the second type of integrated circuit dice, the separately applying including configuring the second boundary scan test stream to test each integrated circuit die of the second type of integrated circuit dice in both transmit and receive directions by simulating loopback of transmit and receive pins of the respective integrated circuit die of the second type of integrated circuit dice.

10. The testing apparatus of claim 9 wherein the controller is configured to apply, seriatim, the respective first boundary scan test stream to the respective test access port of the first type of integrated circuit dice and the respective second boundary scan test stream to the respective test access port of the second type of integrated circuit dice.

11. The testing apparatus of claim 9 wherein the controller is configured to apply, in parallel, the respective first boundary scan test stream to each respective test access port of the first type integrated circuit dice and the respective second boundary scan test stream to each respective test access port of the second type of integrated circuit dice.

12. The testing apparatus of claim 9 wherein, when the respective integrated circuit die has a first boundary scan register chain of a certain length and is connected for transmission to and reception from another integrated circuit die having a second boundary scan register chain of the certain length, the controller is configured to simulate direct loopback of transmit and receive pins of the respective integrated circuit die.

13. The testing apparatus of claim 9 wherein, when the respective integrated circuit die has a first boundary scan register chain of a certain length and is connected for transmission to and reception from another integrated circuit die having a second boundary scan register chain of a second length different from the certain length, the controller is configured to simulate delayed loopback of transmit and receive pins of the respective integrated circuit die.

14. The testing apparatus of claim 13 wherein the controller is configured to delay loopback of the transmit and receive pins by adding idle cycles to a shorter one of the first and second boundary scan register chains.

15. The testing apparatus of claim 9 wherein the controller is configured to apply a third boundary scan test stream to a test access port of the multi-chip module as a whole.

16. A multi-chip module comprising:
   a plurality of integrated circuit dice, each respective integrated circuit die comprising a respective boundary scan register chain and a respective test access port for the respective boundary scan register chain of the respective integrated circuit die;
   a test access port for testing of a boundary scan register chain spanning the multi-chip module as a whole; and
   a plurality of input/output pins; wherein:
   a first subset of the plurality of input/output pins includes first pins configurable for use for run-time functional signals during run-time operation of the multi-chip module, and configurable in a test mode as pins of a device-wide test access port; and
   a second subset of the plurality of input/output pins, separate from the first subset of the plurality of input/output pins, the second subset of the plurality of input/output pins including second pins configurable for use for run-time functional signals during run-time operation of the multi-chip module, and configurable in the test mode as pins of respective individual test access ports for each of the respective integrated circuit dice.

* * * * *